US012574040B2

(12) United States Patent　　(10) Patent No.:　US 12,574,040 B2

Abuelkheir　　(45) Date of Patent:　Mar. 10, 2026

---

(54) SIGNAL MEASUREMENT

(71) Applicant: Analog Devices International Unlimited Company, County Limerick (IE)

(72) Inventor: Mohamed Khairy Abuelkheir, County Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 145 days.

(21) Appl. No.: 18/525,215

(22) Filed: Nov. 30, 2023

(65) Prior Publication Data

US 2025/0183907 A1　　Jun. 5, 2025

(51) Int. Cl.
　　*H03M 1/12*　　(2006.01)
(52) U.S. Cl.
　　CPC .................................. *H03M 1/1245* (2013.01)
(58) Field of Classification Search
　　CPC ..................................................... H03M 1/1245
　　See application file for complete search history.

(56) References Cited

U.S. PATENT DOCUMENTS

| | | | | |
|---|---|---|---|---|
| 9,197,283 | B1 * | 11/2015 | Nguyen | ................ H03M 1/128 |
| 9,203,350 | B2 | 12/2015 | Dempsey et al. | |
| 9,397,684 | B1 * | 7/2016 | Barrenscheen | ..... H03M 1/1023 |
| 9,589,377 | B1 * | 3/2017 | Bordow | ............ G01R 13/0272 |
| 10,298,189 | B1 * | 5/2019 | Lassen | .................. H03M 1/183 |

| | | | | |
|---|---|---|---|---|
| 10,425,098 | B2 | 9/2019 | Liu et al. | |
| 10,591,429 | B2 | 3/2020 | Lyden et al. | |
| 10,700,696 | B1 | 6/2020 | Hudlow et al. | |
| 10,739,306 | B2 | 8/2020 | Gu et al. | |
| 10,784,883 | B1 * | 9/2020 | Tripathi | ................ H03M 1/442 |
| 2006/0056558 | A1 * | 3/2006 | Chou | ..................... G09G 5/008 |
| | | | | 375/355 |
| 2008/0147761 | A1 * | 6/2008 | Melanson | .......... H03H 17/0455 |
| | | | | 708/313 |
| 2010/0013691 | A1 * | 1/2010 | Mboli | .................. H03M 1/125 |
| | | | | 341/155 |
| 2012/0314466 | A1 * | 12/2012 | Goerges | ............ H02M 7/53873 |
| | | | | 363/78 |
| 2013/0064148 | A1 * | 3/2013 | Boo | ..................... H04L 27/2092 |
| | | | | 370/281 |

(Continued)

OTHER PUBLICATIONS

European Search Report for EP Application No. 24211002.1, dated Apr. 24, 2025, 19 pages.

*Primary Examiner* — Chico A Foxx

(74) *Attorney, Agent, or Firm* — DLA Piper LLP (US)

(57)　　　　ABSTRACT

The present disclosure relates to a signal measurement system, a controller and a method for digitally converting an input signal. The signal measurement system comprises an analog-to-digital converter (ADC) configured to receive the input signal and generate a plurality digital samples of the input signal. The signal measurement system also comprises a controller configured to control the number of digital conversions of the input signal performed by the ADC per unit time, based on at least one of a characteristic of the input signal and/or a digitally determined characteristic of the input signal, wherein the digitally determined characteristic of the input signal is based on one or more previous digital samples of the input signal generated by the ADC.

20 Claims, 9 Drawing Sheets

900

910

205　　215

210

220

318　　355

(56)     References Cited

U.S. PATENT DOCUMENTS

| | | | |
|---|---|---|---|
| 2013/0135126 A1* | 5/2013 | Cho | H03M 1/462 |
| | | | 341/110 |
| 2013/0265184 A1* | 10/2013 | Carpentier | H03M 1/34 |
| | | | 341/172 |
| 2014/0343448 A1* | 11/2014 | Russell | A61B 5/0002 |
| | | | 600/536 |
| 2015/0371638 A1* | 12/2015 | Ma | G10L 15/02 |
| | | | 704/275 |
| 2017/0184658 A1* | 6/2017 | Uemura | H02H 3/087 |
| 2018/0180652 A1* | 6/2018 | Sestok, IV | G01R 27/16 |
| 2018/0283987 A1* | 10/2018 | Hedin | G01M 13/045 |
| 2020/0018742 A1* | 1/2020 | Lopez | G01N 27/4145 |
| 2020/0153477 A1* | 5/2020 | Hu | H04B 1/71637 |
| 2021/0143831 A1 | 5/2021 | Bodnar et al. | |
| 2022/0416807 A1* | 12/2022 | Sanchez | H03M 1/88 |
| 2023/0006685 A1 | 1/2023 | Bodnar et al. | |

* cited by examiner

200

205    210    215

220

900

910

SIGNAL MEASUREMENT

TECHNICAL FIELD

The present disclosure relates to a signal measurement system, method and controller for digitally converting an input signal.

BACKGROUND

For many different purposes, it can be useful to measure one or more characteristics of a device under test (DUT) at different test signal frequencies. For example, the impedance of a DUT may be measured by applying a test signal, such as a test current or test voltage, to the DUT and measuring the resultant current through, or voltage across, the DUT. By determining the impedance at various different frequencies of test signal, useful information relating to the DUT can be determined. One specific example of this is electrochemical impedance spectroscopy (EIS), where a test signal is applied to a battery (which is the DUT) and swept across a range of frequencies. The resultant current or voltage signal from the battery is measured in order to determine the impedance of the battery at various different test signal frequencies. Such EIS of a battery can enable the extraction of different insights about the battery, such as its state of health (SoH), state of charge (SoC) and the temperature of the battery.

In systems where a characteristic of a DUT is determined over a range of test signal frequencies, it can be difficult accurately to determine the characteristic(s) across the whole range of frequencies. For example, determination of the characteristic(s) may include some signal processing, such as discrete Fourier transform (DFT), fast Fourier transform (FFT), discrete cosine transform (DCT), wavelet processing, etc. This often requires an analog to digital converter (ADC) to convert the DUT signal (for example, to covert a signal indicative of the current through, or voltage across, the DUT) into a series of digital samples. The digital samples may be built up over time and then analysed by digital signal processing. Building up multiple digital samples over time means that the digital samples can represent multiple periods of the measured signal, which is often required for accurate digital signal processing. In order to digitally convert the signal accurately, it is typical for the ADC conversion frequency to be greater than the highest signal frequency that is expected to be measured, most normally an ADC conversion frequency at least twice that of the highest signal frequency (i.e., the ADC conversion frequency is typically equal to, or greater than, the Nyquist frequency). Therefore, the ADC conversion frequency is often set based on the top end of the spectroscopy frequency range.

However, the bottom end of the spectroscopy frequency range can be much smaller, for example many orders of magnitude smaller, than the top end. This means that in order to accommodate the highest frequencies in the spectroscopy range, when the signal is at the bottom end of the spectroscopy range the ADC may be generating a very large number of samples per period of the signal. Such a large number of digital samples per period is usually not required and represents an ADC power inefficiency. Furthermore, it also places additional burden on the memory and processing speed requirements for storing the digital samples and analysing the digital samples.

SUMMARY

In a first aspect of the disclosure there is provided a signal measurement system for digitally converting an input signal, the system comprising: an analog-to-digital converter, ADC, configured to: receive the input signal; and generate a plurality digital samples of the input signal; and a controller configured to control a number of digital conversions of the input signal performed by the ADC per unit time, based on at least one of: a characteristic of the input signal; and/or a digitally determined characteristic of the input signal, wherein the digitally determined characteristic of the input signal is based on one or more previous digital samples of the input signal generated by the ADC.

In a second aspect of the disclosure there is provided a method for digitally converting an input signal, the method comprising an analog-to-digital converter, ADC: receiving the input signal and generating a plurality digital samples of the input signal; and a controller controlling a number of digital conversions of the input signal performed by the ADC per unit time, based on at least one of: a characteristic of the input signal; a characteristic of a measurement of the input signal, wherein the measurement of the input signal is based on one or more previous digital samples of the input signal generated by the ADC.

In a third aspect of the disclosure there is provided a controller for controlling a number of digital conversions of the input signal performed by an analog to digital converter, ADC, per unit time, based on at least one of: a characteristic of an input signal, wherein the input signal is input to the ADC for digital conversion and/or a digitally determined characteristic of the input signal, wherein the digitally determined characteristic of the input signal is based on one or more previous digital samples of the input signal generated by the ADC.

DRAWINGS

Aspects of the present disclosure are described, by way of example only, with reference to the following drawings, in which.

DETAILED DESCRIPTION

This disclosure relates to a measurement system that may improve the power efficiency of analog to digital converters (ADCs) and reduce the processing requirements (for example, memory size and/or processing speeds) of a signal analyser that analyses the digital samples output by the ADC, whilst still maintaining a good level of conversion accuracy. It has many different uses/applications, with one particularly application being for use in spectroscopy measurement of a device under test (DUT), such as impedance spectroscopy of a battery.

Figure 1A:
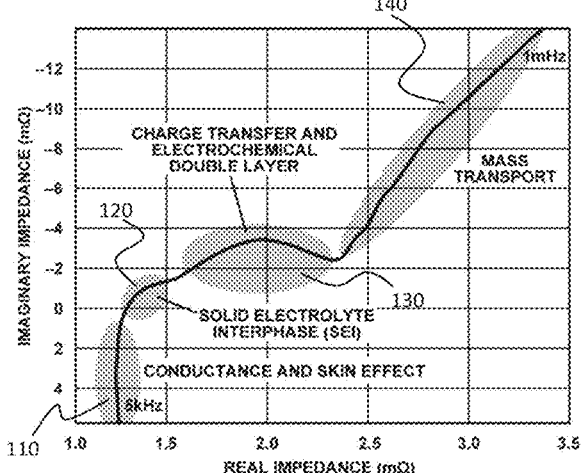
FIG. 1A shows an example Nyquist plot of the impedance of a battery.

FIG. 1A shows an example Nyquist plot of the impedance of a battery (in this example, a Li-Ion battery).

Figure 1B:
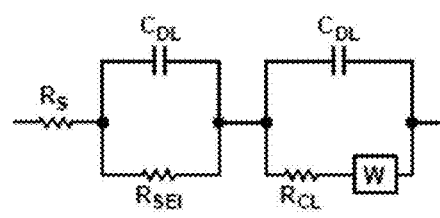
FIG. 1B shows an example Li-Ion battery equivalent circuit model.

FIG. 1B shows an example Li-Ion battery equivalent circuit model (specifically the Two Randel Model). The circuit model comprises an electrolytic (Ohmic) resistance (RS), a double layer capacitance (CDL), a solid electrolyte interface resistance (RSEI), a charge transfer resistance (RCT), and a Warburg (diffusion) resistance (W).

Returning to FIG. 1A, the example Nyquist plot has been generated by applying a test signal (a current or voltage) to the battery, and measuring the voltage across, or current through, the battery as the test signal is swept through a range of frequencies between about 1 mHz to 5 kHz (although any other suitable range of frequencies may be used). From the known amplitude of the test signal and the measured battery voltage or current, the battery impedance may be determined for each test signal frequency. The impedance of the battery at different sub-ranges or regions of test signal frequency range represents a measure of different characteristics/information of the battery, for example corresponding to different chemical and physical processes.

For example, the impedance when the test signal is in the upper kHz sub-range 110 is dominated by Rs and provides information relating to the conductance and skin effect of the battery. The impedance when the test signal is in the lower kHz/upper Hz sub-range 120 is dominated by RSEI and provides information relating to the solid electrolyte interphase (SEI) of the battery. The impedance when the test signal is in the Hz sub-range 130 is dominated by CDL and RCL and provides information relating to the charge transfer and electrochemical double layer of the battery. The impedance when the test signal is in the mHz sub-range 140 is dominated by W and provides information relating to the mass transport of the battery.

As can be seen, the range of test signal frequencies spans a very wide range, in this example about six orders of magnitude. In a system where the DUT derived signal (in this example, the battery voltage or current) is measured by way of digital conversion by an ADC, typically the ADC conversion frequency is set in consideration of the top end of the frequency range, so as to achieve a sufficient level of conversion accuracy for the whole range of test signal frequencies. For example, it may be set to be at least the Nyquist frequency, which in this example would be 2×5 kHZ, which is 10 kHz. In order to perform digital signal analysis on the digital samples output by the ADC (for example any one or more of DFT, FFT, DCT, wavelet processing), multiple samples are usually accumulated (for example, stored or cached in memory) and then analysed. For many types of signal analysis, in order to perform sufficiently accurate analysis it is necessary to have digital samples representing multiple periods of the measured signal. In the example of FIGS. 1A and 1B, when the test signal is 5 kHz, the battery voltage will also be about 5 kHz and digital samples representing multiple (for example, ten, twenty, fifty, one hundred, etc) periods of the battery voltage may be accumulated and then analysed. This requires sufficient digital memory storage to retain the required number of digital samples before they are analysed, after which they may be discarded.

However, the inventors have recognised that an issue may be encountered when the test signal frequency is lower. In particular, when the test signal is operating towards the bottom of the frequency range, a very large number of digital samples will be generated by the ADC per period of the signal. In the specific example given above, if the ADC conversion frequency is 10 kHz and the test signal frequency is 1 mHz, the period of the signal will be about 1000 seconds, during which the ADC will generate over one million samples. Regardless of the specific numbers, it can be seen that if the frequency range of the test signal is large (for example, spanning at least two orders of magnitude), when the test signal is towards the bottom end of the range the number of digital samples generated by the ADC per period of the signal will be large, which means that a very large number of samples will be generated to span multiple periods of the signal. In view of this, it may be necessary to design the digital signal processor to have memory sufficiently large to store a very large number of samples and have processing speeds/power to process a very large number of samples, even though the memory and processing capacity will only be fully utilised when the test signal is towards the bottom of the frequency range. This represents additional cost and complexity. Alternatively, the digital signal processor may be designed to have more limited memory and processing capacity (for example sufficient memory and processing capacity to accurately process the signal at mid to high test signal frequencies) and analyse digital samples representing only a small number of periods of the signal (for example, one period, or two periods, etc) when the test signal is relatively low frequency. Analysing digital samples representing only a very small number of signal periods tends to reduce the accuracy of the analysis, for example resulting in a larger standard deviation of the measured signal and characteristics that are determined by the signal processing (for example, a larger standard deviation of determined battery impedance in the example given above). Furthermore, generating a very large number of digital samples per signal period when the test signal is at a relatively low frequency also represents a significant, inefficient level of power consumption from the ADC.

In view of these challenges, the inventors have developed a system where the number of digital conversions performed by the ADC per unit time is controlled based on a reported characteristic of the signal input to the ADC and/or a characteristic of the measured signal that is derived from previous digital samples output by the ADC. For example, if the frequency of the signal input to the ADC is reported as being relatively low, the ADC may be controlled in such a way that the number of digital conversions performed per unit time is reduced compared with when the input signal is reported to have a higher frequency. In this example, whenever the frequency is lower, the number of digital samples produced by the ADC per period of the measured signal may be reduced compared with if the ADC continues to convert at a fixed conversion frequency. Since the measured signal is relatively low frequency, fewer samples per unit time are required to accurately represent the signal compared with when it is higher frequency, so high accuracy conversion can still be maintained. However, digital signal processing requirements (for example, memory size and/or processing power) may be reduced whilst still being able to store and process digital samples representing a sufficiently large number of signal periods, since fewer samples are being output by the ADC for each period of the measured signal compared with if the ADC continues to convert at a fixed conversion frequency. Therefore, accurate signal processing and analysis may be performed whilst maintaining memory and processing speed requirements at a reasonable level. Furthermore, because the ADC is producing fewer conversions per unit time, its power consumption is also reduced.

Figure 2:
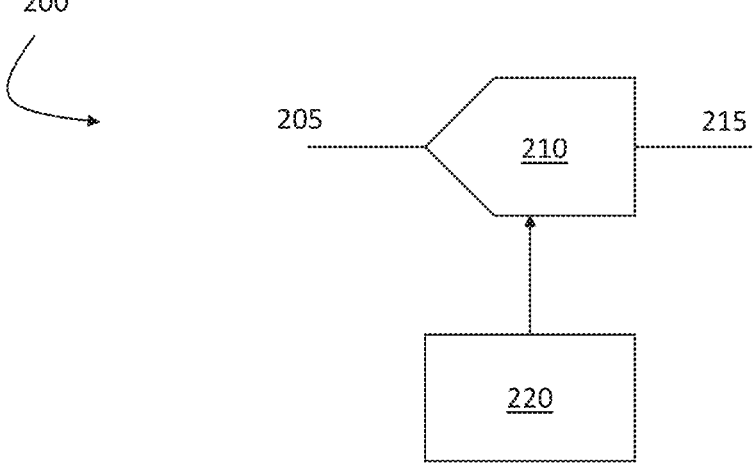
FIG. 2 shows a schematic diagram of an example signal measurement system in accordance with an aspect of present disclosure.

FIG. 2 shows an example signal measurement system 200 in accordance with an aspect of present disclosure. The system comprises an ADC 210 that is configured to receive an input signal 205 and generate over time a plurality of digital samples 215 of the input signal 205. The system 200 also comprises a controller 220 that is configured to control the number of digital conversions of the input signal 205 performed by the ADC 210 per unit time (in other words, control the conversion frequency or rate of the ADC 210) based on at least one of: a characteristic of the input signal 205 (for example, a frequency of the input signal 205) and/or a digitally determined characteristic of the input signal 205 that is based on one or more previous digital samples 215 of the input signal 205 generated by the ADC 210. The controller 220 may be any suitable unit/device/circuit configured to perform the control functionality described herein, for example the controller 220 may comprise any one or more of a processor or microprocessor, a microcontroller, fixed or programmable logic (such as an FPGA), a dedicated hardware circuit, etc.

Figure 3:
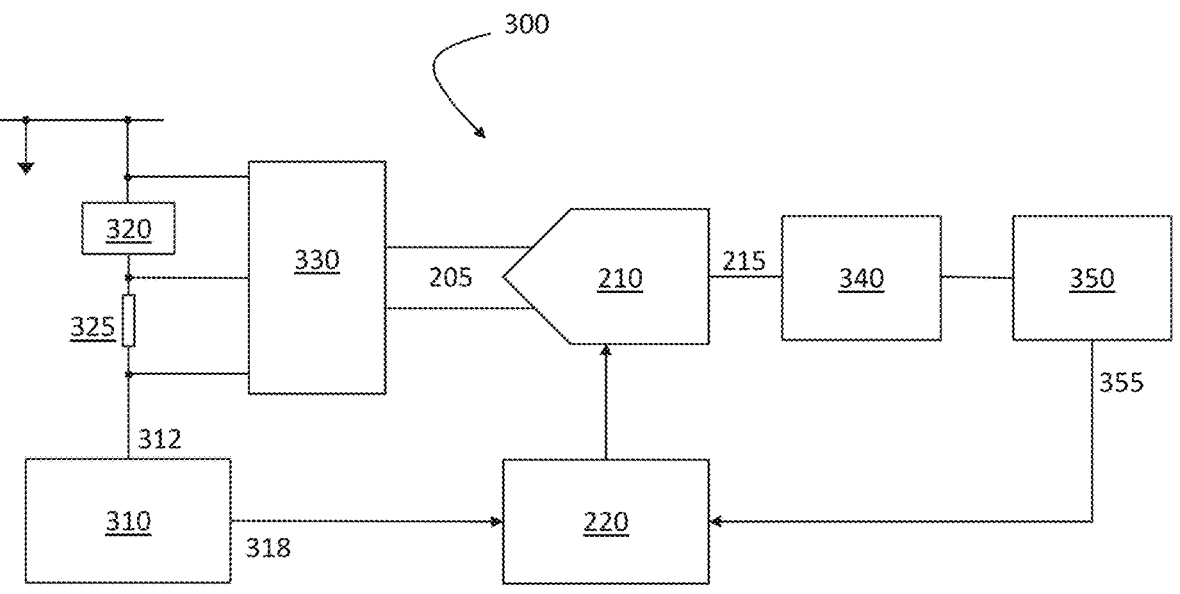
FIG. 3 shows a schematic diagram of an example signal measurement system in accordance with a further aspect of the present disclosure.

FIG. 3 shows a particular example signal measurement system 300 in accordance with another aspect of the present disclosure. The signal measurement system 300 is merely one example application of the principles disclosed herein in order to help with better understanding, but is not the only application, as described later. The system 300 is suitable for measuring a characteristic of a DUT 320, with the input signal 205 being a signal that is derived from the DUT 320. In one particular example, the characteristic of the DUT 320 may be the impedance of the DUT (which is the example described in more detail above with reference to FIGS. 1A and 1B, where the DUT is a battery). The system 300 comprises the ADC 210 and the controller 220 described above. It further comprises a signal generator 310 that is configured to generate a test signal 312, for example a test signal 312 having one or more non-zero frequencies. The signal generator 310 is suitable for coupling to the DUT 320 in order to apply the test signal 312 to the DUT 320 when measuring a characteristic of the DUT 320. If the system 300 is configured to perform spectroscopy measurements, for example impedance spectroscopy as described earlier with reference to FIGS. 1A and 1B, the signal generator 310 may be configured to vary the frequency of the test signal 312 across a range of different frequencies. The test signal 312 may have any suitable wave shape, for example sinusoidal, square wave, triangular wave, etc. and may be of any type suitable for measurement/testing of the DUT, for example a current signal, a voltage signal, etc. The amplitude/magnitude of the test signal 312 may be known so that it can be used in the determination of the DUT characteristic. In the particular example of FIG. 3 where the system 300 is configured to measure the impedance of the DUT 320, the test signal 312 is a current signal and the input signal 205 is the voltage across the DUT 320.

The system 300 may optionally comprise a reference device 325, for use in system calibration. In the particular example of FIG. 3, the reference device 325 is a reference resistor that has a known, high accuracy impedance. The system 300 may also optionally have a multiplexer (MUX)/ amplifier 330 that is configured to couple the ADC 210 either to the DUT 320 or the reference device 325, and optionally also amplify the signal. For example, the MUX/ amplifier 330 may first couple the ADC 210 to the reference device 325 so that the input signal 205 is a signal derived from the reference device 325 (for example, the voltage across the reference device 325) and the system 300 can be calibrated for accurate measurement. After calibration, the MUX/amplifier 330 may then couple the ADC 330 to the DUT 320 so that the input signal 205 is a signal derived from the DUT 320 (for example, the voltage across the DUT 320). It will be appreciated that in an alternative, the reference device 325 and the MUX/amplifier 330 may be omitted, with the system 300 being configured such that the ADC 210 input and the DUT 320 are directly coupled to each other (or alternatively indirectly coupled via an amplifier).

The system 300 also optionally includes a digital filter 340 coupled to the output of the ADC 340 to receive the plurality of digital samples 215, generate one or more filtered digital values based on the plurality of digital samples 215, and output the one or more filtered digital values to a signal analyser 350. By including a digital filter 340, the information received by the signal analyser 350 may be improved, for example by filtering out or reducing unwanted/unneeded information. In one example, the digital filter 340 may be a sinc filter, for example to reduce the number of samples received by the signal analyser 350, for example in the event that a very high frequency ADC 210 is used. However, it will be appreciated that the digital filter 340 may be omitted entirely, in which case the digital samples 215 output by the ADC 210 may be directly received by the signal analyser 350.

The signal analyser 350 is configured to analyse the plurality of digital samples 215 to digitally determine at least one characteristic of the input signal 205 and/or DUT 320 based on the received digital samples 215. For example, it may determine the amplitude/magnitude of the input signal 205 (for example, the voltage or current amplitude/magnitude of the input signal 205). Additionally, or alternatively, it may determine the phase of the input signal 205 (for example, the phase of the input signal relative to some other signal, such as the phase of the input signal relative to the test signal 312, or relative to some other reference signal). Additionally or alternatively, it may digitally determine any one or more of: an average (mode, median and/or mean) of the magnitude/amplitude of the input signal 205; the variance (which includes the standard deviation, or sigma, since variance and standard deviation are intrinsically linked) of the magnitude/amplitude of the input signal 205; the entropy of the magnitude/amplitude of the input signal 205 (which is a measure of the lack of order or predictability of the signal); the average (mode, median and/or mean) of the phase of the input signal 205 (for example, the average phase of the input signal relative to a reference signal); the variance of the phase of the input signal 205; the entropy of the phase of the input signal 205. The input signal 205 may comprise a single frequency, (for example, if it is a single tone signal) or multiple frequencies (for example, a fundamental frequency and one or more harmonic frequencies, or multiple frequencies if the input signal 205 is a multi-tone signal in the case of the test signal 312 being a multi-tone signal, or a continuous band of frequencies in the case of the test signal 312 comprising a continuous band of frequencies, etc). At least one of the above identified characteristics may be identified for at least one of the signal frequencies of the input signal 205. Additionally, or alternatively, the signal analyser 350 may digitally determine the frequency (or frequencies) of the input signal 205 from the plurality of digital samples 215.

At least one of these digitally determined characteristics may be output to the controller 220 as the one or more digitally determined characteristics 355. Additionally, or alternatively, the controller 220 may be configured to receive one or more reported characteristics 318 of the input signal 220, for example from the signal generator 310 (FIG. 3 shows the controller 220 receiving both the digitally determined characteristic(s) 355 and reported characteristic(s) 318, but in an alternative it may receive the digitally determined characteristic(s) 355 or the reported characteristic(s) 318). In contrast to the one or more digitally determined characteristics 355, the one or more reported characteristics 318 are not determined based on digital samples 215 generated by the ADC 210 and are instead known by some other means. For example, the one or more reported characteristics 318 may comprise the frequency (or frequencies) of the input signal 205, which in this example may be known by the signal generator 310 because it is generating the test signal 312, which will have substantially the same frequency as the input signal 205. As a further example, the one or more reported characteristics 318 may comprise digital data indicative of the frequency (or frequencies) of the input signal 205, for example register values received from the signal generator 310 or any other circuit/unit. Additionally, or alternatively, for each of at least one frequency of the input signal 205, the reported characteristic(s) 355 may comprise an average (mode, median and/or mean) of the magnitude/amplitude of the input signal 205 and/or the phase of the input signal 205 (for example, the phase of the input signal relative to a reference signal).

The controller 220 is configured to use the received digitally determined characteristic(s) 335 and/or reported characteristic(s) 318 in order to control the number of digital conversions of the input signal 205 performed by the ADC 210 per unit time.

Figure 4:
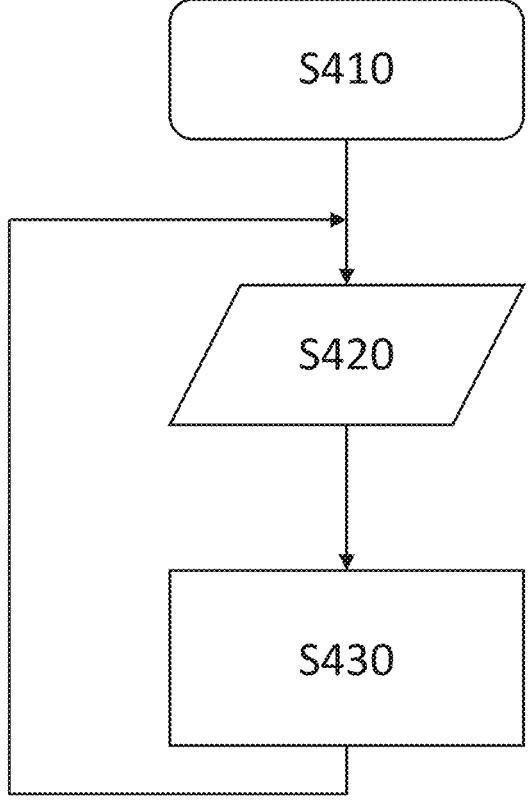
FIG. 4 shows an example flow diagram representing an example operation of the controller of FIG. 2 or FIG. 3.

FIG. 4 shows an example flow diagram representing an example operation of the controller 220. Step S410 represents the start of the process, for example system start-up or turn on. In Step S420, the controller 220 receives one or more reported characteristic 318, for example from the signal generator 310 or any other unit or circuit that can report on at least one characteristic of the input signal 205. In one particular example, the reported characteristic(s) 318 includes a frequency of the input signal 205, although it could additionally or alternatively be any of the other reported characteristics 318 described above. In one particular example, the reported characteristic received in step S420 may be a frequency, for example a single frequency if the input signal 205 comprises a single tone (which may be the case if the signal generator 310 is configured to generate a single tone test signal 312), or two or more frequencies, such as a fundamental frequency and one or more harmonic frequencies. In Step S430, the controller 220 may determine, based on the reported characteristic(s) 318, the number of digital conversions per unit time that the ADC 210 should perform and then control the ADC 210 to perform that number of digital conversions per unit time. Different techniques for how the controller 220 may control the ADC 210 are described later. In one particular example, the controller 220 may comprise memory (or have access to memory) that stores a look-up table of values for digital conversions per unit time in dependence on the received reported characteristic(s) 318. In another example, the controller 220 may be configured to comprise logic for performing an algorithm that uses the reported characteristic(s) (for example, input signal 205 frequency) as an input variable to the algorithm that outputs a value for the number of digital conversions per unit time.

In one particular example, the reported characteristic 318 may comprise a frequency of the input signal 205 and the controller 220 may be configured to set a relatively low number of digital conversions per unit time when the input signal 205 frequency is relatively low, and set a relatively high number of digital conversions per unit time when the input signal 205 frequency is relatively high. For example, if the input signal 205 frequency is a first, relatively low frequency (such as 1 Hz), the controller 220 may set the number of digital conversion per unit time to a relatively low first number of digital conversion per unit time. If the input signal 205 frequency is a second, relatively high frequency (such as 1 kHz), the controller 220 may set the number of digital conversion per unit time to a relatively high second number of digital conversion per unit time, where the first number of digital conversions per unit time is less than the second number of digital conversions per unit time. By doing so, for a range of different input signal frequencies the signal analyser 350 may store and analyse digital samples for a sufficient number of input signal periods to perform accurate signal analysis, whilst minimising ADC 210 power consumption and signal analyser 350 cost, complexity and power consumption. The number of digital conversion per unit time may be proportional to the frequency of the input signal, or there may be predetermined bands of input signal frequencies, each band having a corresponding predetermined number of digital conversions per unit time.

In another example, the reported characteristic 318 may comprise an indication of the magnitude/amplitude of the input signal 205. If, for example, the magnitude/amplitude of the input signal 205 is reported as being very small (for example, less than a predetermined magnitude threshold), it may be helpful to have digital samples corresponding to a larger number of periods of the input signal 205. In this case, the controller 220 may be configured to reduce the number of digital samples per unit time compared with the number that it would otherwise have set, so that for a fixed number of digital samples (since typically the signal analyser 350 will be capable of storing and analysing a fixed number of samples), more periods of the input signal 205 may be represented.

In a further example, the reported characteristic 318 may comprise an indication of the phase of the input signal 205 (for example, its phase relative to the test signal 312). In the example explained above, there is a desire to determine the impedance of the DUT 320, which is made up of real and imaginary (or phase) components. If the DUT 320 has introduced only a small phase difference between the test signal 312 and input signal 205 (for example, a phase that is less than a predetermined phase threshold), it may be more difficult accurately to measure the imaginary (or phase) part of the impedance. Likewise, if the DUT 320 has introduced a relatively large phase difference between the test signal 312 and input signal 205 (for example, a phase that is greater than a further predetermined phase threshold), it may be more difficult accurately to measure the real part of the impedance. In either case, a relatively high ADC sampling rate may be beneficial. As a result, the controller 220 may be configured to increase the number of digital samples per unit time compared with the number it would otherwise have set.

The controller 220 may be configured to loop through Steps S420 and S430 until the system 200, 300 ceases operation (for example, when it is turned off). In this way, each time the reported characteristic 318 changes, for example because the test signal 312 frequency has been changed, the controller 220 may become aware of it in Step S420 and then in Step S430 adjust accordingly the number of digital conversions performed per unit time.

Figure 5:
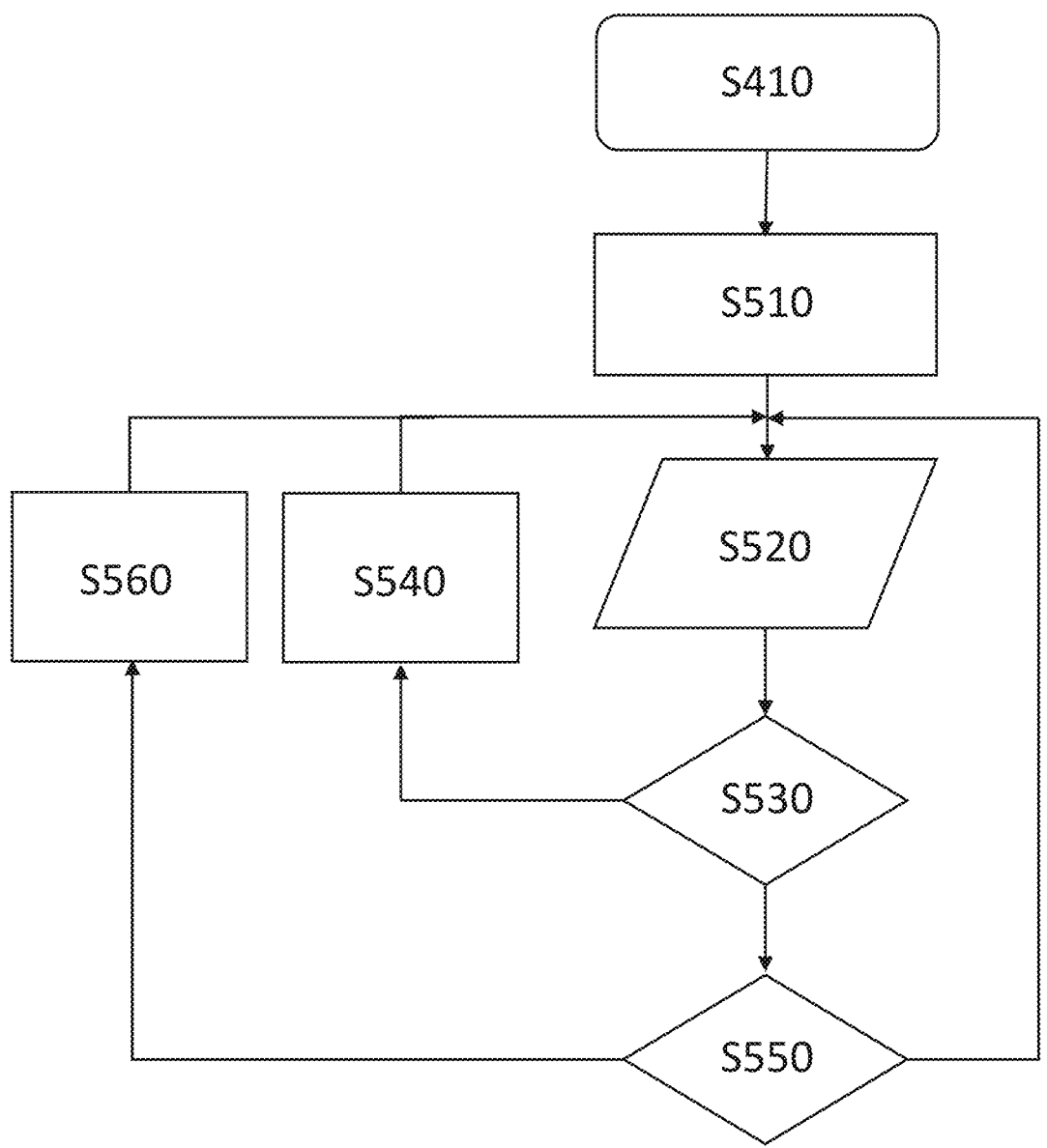
FIG. 5 shows an example flow diagram representing a further example operation of the controller of FIG. 2 or FIG. 3.

FIG. 5 shows an example flow diagram representing a further example operation of the controller 220. Like features with FIG. 4 are represented using the same reference numerals and will not be described further, for the sake of efficiency. In Step S510, the controller 220 may set the number of digital samples performed per unit time an initial, default value and control the ADC 210 accordingly. In Step S520, the controller 220 receives one or more digitally determined characteristic(s) 355. In Steps S530 and S550, the controller 220 determines whether or not the number of digital samples performed per unit time should be adjusted or kept the same. In the particular example of FIG. 5, the received digitally determined characteristic(s) 355 comprises any one or more of: the amplitude/magnitude of the input signal 205; the phase of the input signal 205; an average of the magnitude/amplitude of the input signal 205; the variance of the magnitude/amplitude of the input signal 205; the entropy of the magnitude/amplitude of the input signal 205; the average of the phase of the input signal 205; the variance of the phase of the input signal 205; and/or the entropy of the phase of the input signal 205. For each of these characteristics the controller 220 may have a target value and/or particular threshold values and/or ranges of values. The controller 220 may be configured to compare each received characteristic against the appropriate target value and/or particular threshold values and/or ranges of values in order to determine whether, and by how much, to adjust the control of the ADC 210. For example, the variance and/or entropy may depend on the accuracy with which the plurality of digital samples 215 are representing the input signal 205. If the variance and/or entropy are relatively high then it is possible that the plurality of digital samples 215 are not representing the input signal 205 with sufficient accuracy for the signal analyser 360 to perform an accurate and reliable analysis. Therefore, in this case, Step S530 may be configured to compare the received variance and/or entropy characteristic against a predetermined threshold value. If it is greater than the threshold value, the process may proceed to Step S540 where the controller 220 controls the ADC 210 to adjust the number of digital conversions performed per unit time (for example, increasing the number so that each period of the input signal 205 is more accurately represented by the digital samples 215, or decreasing the number so a fixed number of digital samples will represent more periods of the input signal 205, which should improve the accuracy of signal analysis performed on the digital samples 215. Whether the controller 220 is configured to increase or decrease the ADC 210 conversion rate may be dependent on the nature of the signal being measured and the types of signal analysis being performed on the digital samples, and so is an implementation detail). If, however, it is less than the threshold value, it is determined that the variance and/or entropy is at an acceptable level and the method may proceed to Step S550.

If the digitally determined characteristic(s) 355 comprises the amplitude/magnitude of the input signal 205 and/or an average of the amplitude/magnitude of the input signal 205, the controller 220 may have a target or expected value against which the digitally determined characteristic can be compared, or may have a threshold value below which the signal is considered to be relatively small (which is analogous to the amplitude/magnitude example described above with reference to FIG. 4). For example, the system 300 may be performing calibration using the reference device 325, in which case there will be a target or expected amplitude/magnitude (since the amplitude/magnitude of the test signal 312 will also be known). If the size of the difference between the received digitally determined characteristic and the target or expected value is greater than a predetermined tolerance threshold, the method may proceed to Step S540 so that the input signal 205 can be represented by the plurality of digital samples 215 more accurately in the future. However, if the size of the difference between the received digitally determined characteristic and the target or expected value is smaller than the predetermined tolerance threshold, the method may proceed to Step S550. Likewise, if the digitally determined characteristic(s) 355 comprises the phase of the input signal 205 and/or an average of the phase of the input signal 205, the controller 220 may have a target or expected value against which the digitally determined characteristic can be compared, or may have a threshold value below which the phase is considered to be relatively small and/or a threshold value above which the phase is considered to be relatively large (which is analogous to the amplitude/magnitude example described above with reference to FIG. 4). Based on that comparison, control of the ADC may be adjusted to make an appropriate change to the number of conversions per unit time.

In Step S550, the controller 220 may determine whether or not to control the ADC 210 in a way that reduces the number of digital conversions performed per unit time. The purpose of this is to try to achieve a conversion rate that satisfies Step S530 but with the minimum number of conversions per unit time, thereby minimising power consumption of the ADC 210. If it is determined that the number of conversions per unit time should be reduced, the method proceeds to Step S560 where the controller 220 controls the ADC 210 in a way that reduces the number of conversions per unit time. If, however, it is determined that the number of conversions per unit time should not be reduced, the method returns to step S520.

The determination of Step S550 may be made in a number of different ways. In one example, Step S550 may always determine that the number of digital conversions per unit time should be decreased and the method always proceed from Step S550 to Step S560. On this basis, the conversion rate may be continually decreased until Step S530 determines that it is too low and increases the conversion rate via Step S540. This should result in the conversion rate being continually adjusted up and down about the ideal conversion rate. In an alternative, Step S550 may make the determination based at least in part on the determination of Step S530. For example, if the received digitally determined characteristic is only just within the target/expected range, then it may be determined in Step S550 that the conversion rate should not be changed. However, if the received digitally determined characteristic is well within the target/expected range, then it may be determined in Step S550 that the conversion rate should be reduced on the basis that subsequently the digitally determined characteristic is likely still to remain within the target/expected range.

A further benefit of this mode of operation is that the conversion rate of the ADC 210 is not tied inflexibly to the frequency of the input signal 205, in which case it would usually be oversampled with the ADC 210 conversion frequency being multiples larger than the frequency o the input signal 205. Instead, the conversion rate of the ADC 210 is linked to the outcomes of digital signal analysis, which means that the controller 220 may control to the ADC 210 to convert at any rate, potentially sweeping the ADC 210 through a wide range of conversion frequencies that include under sampling and oversampling frequencies. This means that if there are interferers or unwanted signals that alias down to the frequency band of interest at particular ADC 210 conversion rates, it should be reflected in the undesirable results in the digitally determined characteristic(s) 355, causing the controller 220 to avoid those ADC conversion rates. Consequently, the overall accuracy of the plurality of digital samples 215 and subsequent signal analysis should be improved by virtue of finding the optimal ADC conversion rate.

The controller 220 may be configured to continually loop back up to Step S520, as shown in FIG. 5, until the system 200, 300 ceases operation (for example, when it is turned off). In this way, after the initial step of S510, the conversion rate of the ADC 210 may be controlled in Steps S520 to S560 based on one or more previous digital samples 215 generated by the ADC 210. Consequently, control of the ADC 210 conversion rate may be continually updated and fine-tuned in order to find the optimum conversion rate and react to any changes in the future (for example, changes in the input signal 205 frequency that then improve or worsen the digitally determined characteristics 355).

Figure 6:
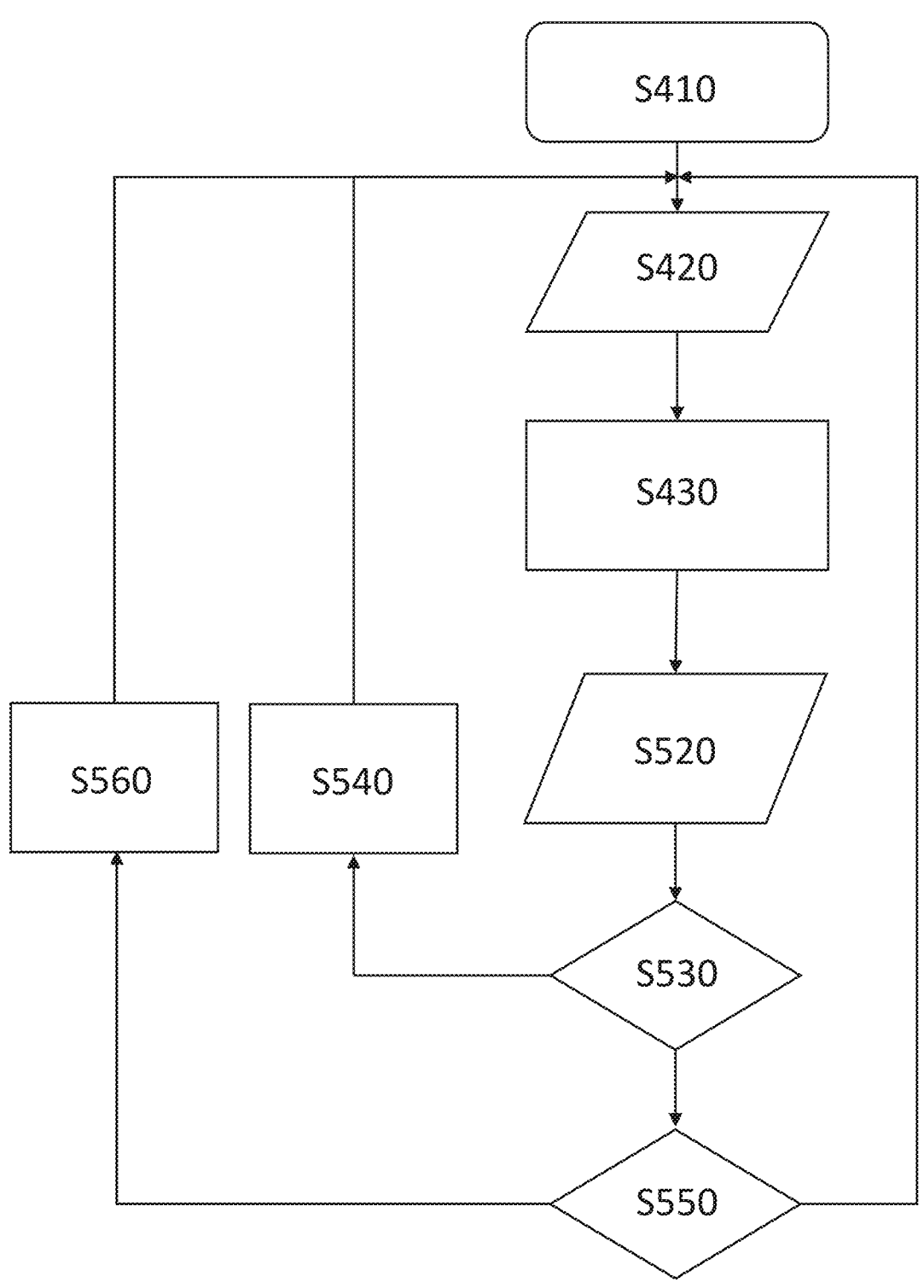
FIG. 6 shows an example flow diagram representing a further example operation of the controller of FIG. 2 or FIG. 3.

FIG. 6 shows an example flow diagram representing a further example operation of the controller 220. Like features with FIGS. 4 and 5 are represented using the same reference numerals and will not be described further, for the sake of efficiency. As can be seen, the process of FIG. 6 essentially combines those of FIGS. 4 and 5 so that the controller 220 makes use of both the reported characteristic(s) 318 and the digitally determined characteristic(s) 355. In this example, the loop returns to Step S420. In this case, Step S430 may be configured only to adjust the ADC conversion rate if the reported characteristic 318 has changed from the previous iteration. In this way, any conversion rate changes made by Steps S540 or S560 should not immediately be undone by Step S430. In an alternative, the loop may instead return to step S520 so that the reported characteristic 318 is essentially only used at the very start in order to set the initial ADC conversion rate.

It can be seen, therefore, that by controlling the ADC 210 conversion rate in this way, the system 200, 300 is made to be adaptive. In one example benefit, the power efficiency of the system 200, 300 may be improved, since unnecessarily high conversion rates may be avoided when the input signal 205 frequency is relatively low. Furthermore, it may enable an improvement in overall accuracy across the whole frequency range without requiring any additional memory resource, since at lower input signal 205 frequencies digital samples representing more periods of the input signal 205 may be stored and processed for the same amount of memory. Signal analysis performed on data representing more periods of the signal is typically more accurate and reliable. Alternatively, the level of overall accuracy may be maintained whilst reducing the amount of memory resource, thereby saving costs and reducing complexity, since fewer digital samples will be required to represent the same number of periods of the input signal 205 when the input signal 205 is at a relatively low frequency.

Figure 7:
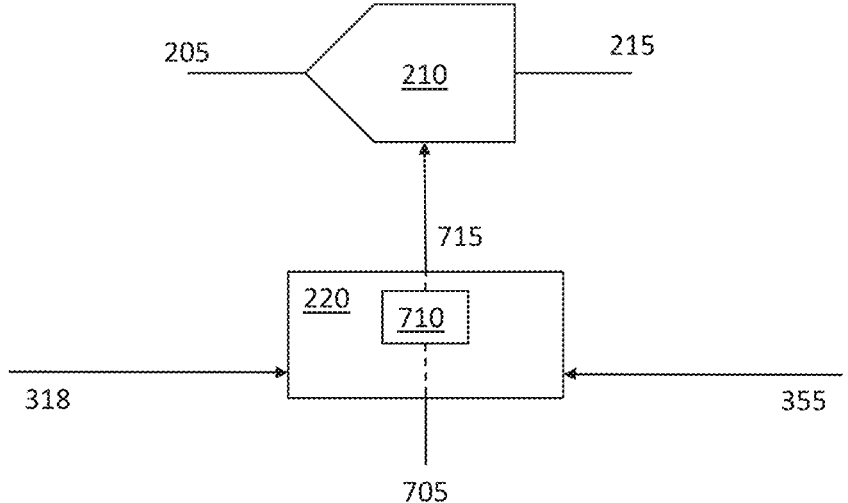
FIG. 7 shows a schematic diagram representing an example way in which the controller of FIG. 2 or FIG. 3 may control the number of digital conversions performed by the ADC.

FIG. 7 shows a schematic diagram representing one example way in which the controller 220 may control the number of digital conversions performed by the ADC 210 per unit time. In this example, the controller 220 is configured to receive a reference clock signal 705 having a reference frequency (for example, a periodic signal such as a periodic square wave signal). The controller 220 comprises a decimator or divider that is configured to divide the reference clock signal 705 by a variable amount N (where N is ≥1) in order to generate a clock signal 715 having a frequency that is less than or equal to the reference frequency. The ADC 210 is configured to receive the clock signal 715 for use in synchronising its processes of digital sample generation, which is a process that will be well understood by the skilled person. In this example, the number of digital conversions performed by the ADC 210 per unit time is dependent on the frequency of the received clock signal 715. As a result, by setting the value N based on the reported characteristic 318 and/or the digitally determined characteristic 355, the controller 220 can control the number of digital conversions performed by the ADC 210 per unit time.

In an alternative, rather than generating the clock signal 715 by dividing a received reference clock signal 405, the controller 220 may be configured to generate the clock signal 715 in any other suitable way. For example, the controller 220 may comprise a reference clock generator in order to generate the reference clock signal 705 for itself, or it may comprise a variable frequency clock generator in order to generate the clock signal 715 directly at the desired frequency.

Figure 8:
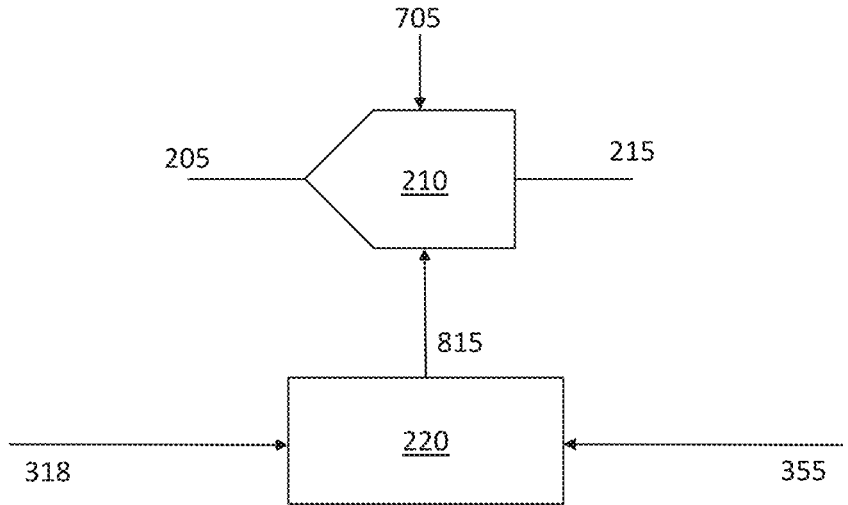
FIG. 8 shows a schematic diagram representing a further example way in which the controller of FIG. 2 or FIG. 3 may control the number of digital conversions performed by the ADC.

FIG. 8 shows a schematic diagram representing another example way in which the controller 220 may control the number of digital conversions performed by the ADC 210 per unit time. In this example, the ADC 210 is configured to receive the reference clock signal 705 for use in synchronising its processes of digital sample generation. The controller 220 is configured to control the status of an enable signal 815 that controls when the ADC 210 is enabled to perform digital conversions. This technique may be referred to as "enable gating". For example, as the skilled person will understand, many ADCs have an enable pin/terminal where the ADC 210 is configured to perform digital conversions when the enable signal at the enable pin/terminal is high (or low) and not perform digital conversions when the enable signal at the enable pin/terminal is low (or high). Thus, regardless of the frequency of the reference clock signal 705, the controller 220 may control the conversion rate of the ADC 210 by controlling when the ADC 210 is, and is not, enabled for conversion. For example, the controller 220 may set the enable signal 405 to be a periodic signal having a particular duty cycle ratio between high and low. When fewer conversions are required per unit time, the controller 220 may either reduce the frequency of the enable signal 405 and/or may adjust the duty cycle ratio so that the ADC 210 is enabled for a smaller proportion of the period of the enable signal 815. In this way, the ADC 210 may be controlled to perform digital conversions at regular intervals, such that the plurality of digital samples 215 should still accurately represent the input signal 205, but the number of digital samples produced per unit time be adjusted. Based on the reference frequency of the reference clock signal 705, it can be determined how many digital conversions should take place for each amount of time that the ADC 210 is enabled by the enable signal 815. As a result, setting the duty cycle ratio and/or frequency of the enable signal 815 should result in a desired conversion rate of the ADC 210.

In a further alternative, rather than controlling the status of an enable signal 815, the controller 220 may be configured to control when the ADC 210 is, and is not, able to perform digital conversions by some other means. For example, it may control when the ADC 210 is powered-up, for example by virtue of controlling a switch(es) that couples the ADC 210 to a power source or by controlling when a power source is powering a larger circuit or device of which the ADC 210 is a part. This may be referred to a "power gating". In this way, when the ADC 210 is powered up, it may generate the plurality of digital samples 215 at a rate that is set by the reference clock signal 705. When the controller 220 powers down the ADC 210, it will cease to generate digital samples 215 of the input signal 205. Thus, by powering up and down the ADC 210 with a frequency and/or duty cycle that is controlled by the controller 220, the number of digital samples generated per unit time may be controlled by power gating in an analogous way to enable gating described above. Power gating in this way may have a particular advantage of minimising power consumption since when the ADC 210 is powered down, it will not be consuming any power at all. Furthermore, in both the power gating and enable gating examples, it may be possible to avoid the need for additional hardware, such as the frequency divider 710 of FIG. 7, or the need for additional system design, verification and validation (since a fixed reference clock signal 705 is used for synchronising the ADC 210 conversion processes).

Figure 9:
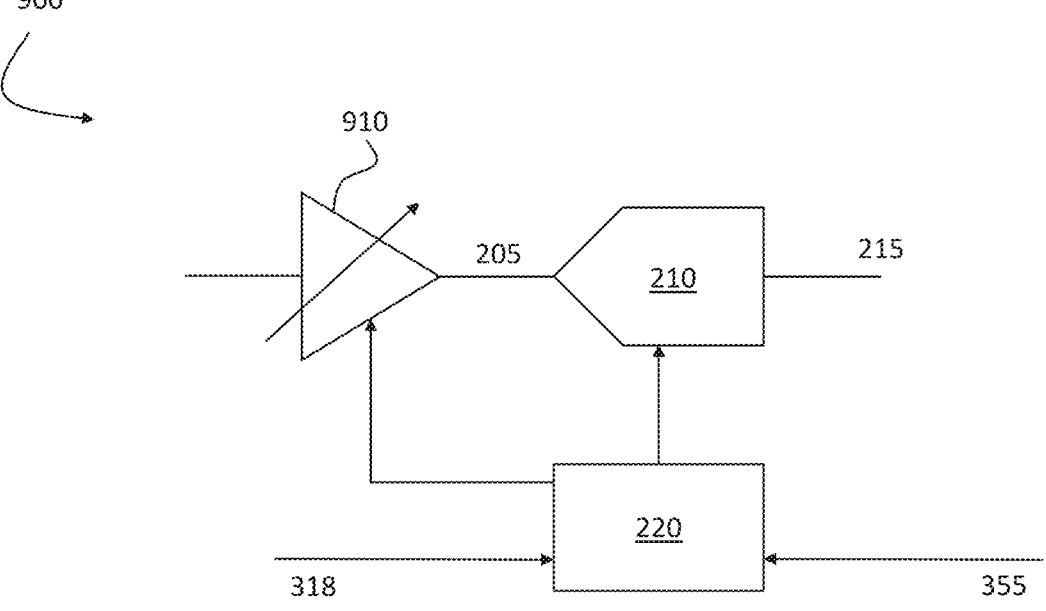
FIG. 9 shows a schematic diagram of an example signal measurement system in accordance with a further aspect of present disclosure.

FIG. 9 shows a schematic diagram of an example signal measurement system 900 in accordance with a further aspect of present disclosure. System 900 is very similar to the systems described above but further includes a variable gain amplifier (VGA) 910. The controller 220 in this example is configured not only to control the conversion rate of the ADC 210 but also the gain of the VGA 910. Control of the VGA 910 gain may be performed based on the reported characteristic 318 and/or the digitally determined characteristic 355 and may help to improve the signal to noise ratio (SNR) of the system. For example, if it is identified from the reported characteristic 318 and/or digitally determined characteristic 355 that the input signal 205 is relatively small (for example, because the magnitude/amplitude, or average magnitude/amplitude, of the input signal 205 is less than a predetermined threshold), the VGA 910 may be controlled to increase its gain. The VGA 910 may be of any suitable type that will be well known to the skilled person and may be controlled in any suitable way, for example by controlling a switched capacitor (SC) gain stage, a resistor gain state, a variable first stage integrator, an integration-time gain stage, etc.

The skilled person will readily appreciate that various alterations or modifications may be made to the above described aspects of the disclosure without departing from the scope of the disclosure.

For example, the above description typically focuses on using the system 200 as part of the performance of imped- ance spectroscopy, particularly battery impedance spectros- copy. However, the system 200 may be used for the mea- surement of an input signal 205 for any purpose. For example, the DUT 320 may be any device having an electrical impedance (of which a battery is one example), but it could alternatively be any other type of device, such as a sensing or sensor device which may be electrical, electro- chemical or a bio-impedance device.

The functionality of the controller 220 may be imple- mented by software, hardware or a combination of software and hardware. For example, it may be implemented by software comprising computer readable code, which when executed on the processor of an electronic device (such as a microprocessor), performs the functionality described above. The software may be stored on any suitable computer readable medium, for example a non-transitory computer- readable medium, such as read-only memory, random access memory, CD-ROMs, DVDs, Blue-rays, magnetic tape, hard disk drives, solid state drives and optical drives. Alterna- tively, the functionality may be implemented by hardware, in which case the controller 220 may comprise dedicated logic circuit, an FPGA, a microcontroller, etc, configured to perform the functionality described above.

The terminology "coupled" used above encompasses both a direct electrical connection between two components, and an indirect electrical connection where the two components are electrically connected to each other via one or more intermediate components.

ASPECTS OF THE DISCLOSURE

Non-limiting aspects of the disclosure are set out in the following numbered clauses.

A signal measurement system for digitally converting an input signal, the system comprising:
an analog-to-digital converter, ADC, configured to:
  receive the input signal; and
  generate a plurality digital samples of the input signal; and
a controller configured to control a number of digital conversions of the input signal performed by the ADC per unit time, based on at least one of:
a characteristic of the input signal;
a digitally determined characteristic of the input signal, wherein the digitally determined characteristic of the input signal is based on one or more previous digital samples of the input signal generated by the ADC.

The signal measurement system of clause 1, wherein the characteristic of the input signal comprises a frequency of the input signal.

The signal measurement system of clause 2, wherein the controller is configured to control the number of digital conversions of the input signal performed by the ADC per unit time such that:
a first number of digital conversions of the input signal are performed by the ADC per unit time when the fre- quency of the input signal is a first frequency; and
a second number of digital conversions of the input signal are performed by the ADC per unit time when the frequency of the input signal is a second frequency,
wherein the first number of digital conversions per unit time is less than the second number of digital samples per unit time, and
wherein the first frequency is less than the second fre- quency.

The signal measurement system of any preceding clause, wherein the characteristic of the input signal comprises any one or more of:
a magnitude of the input signal;
a phase of the input signal.

The signal measurement system of any preceding clause, wherein the digitally determined characteristic of the input signal comprises one or more of:
a magnitude of the input signal;
an average of the magnitude of the input signal;
a variance of the magnitude of the input signal;
an entropy of the magnitude of the input signal;
a phase of the input signal;
an average of the phase of the input signal;
a variance of the phase of the input signal;
an entropy of the phase of the input signal;
a frequency of the input signal.

The signal measurement system of any preceding clause, wherein the ADC is configured to receive a clock signal for synchronisation of digital sample generation.

The signal measurement system of clause 6, wherein the controller is configured to control the number of digital conversions of the input signal performed by the ADC per unit time by controlling a frequency of the clock signal received by the ADC.

The signal measurement system of clause 6 or clause 7, wherein the ADC is configured to receive an enable signal that controls when the ADC is enabled to perform digital conversion, and wherein the controller is configured to control the number of digital conversions of the input signal performed by the ADC per unit time by controlling a state of the enable signal.

The signal measurement system of any of clauses 6 to 8, wherein the controller is configured to control the number of digital conversions of the input signal performed by the ADC per unit time by controlling a supply of power to the ADC.

The signal measurement system of any preceding clause, further comprising a signal analyser configured to analyse the plurality of digital samples to determine any one or more of:

a magnitude of the input signal;
an average of the magnitude of the input signal;
a variance of the magnitude of the input signal;
an entropy of the magnitude of the input signal;
a phase of the input signal;
an average of the phase of the input signal;
a variance of the phase of the input signal;
an entropy of the phase of the input signal;
a frequency of the input signal.

The signal measurement system of any of clauses 1 to 9, further comprising a digital filter configured to:

receive the plurality of digital samples;
generate one or more filtered digital values based on the plurality of digital samples; and
output the one or more filtered digital values.

The signal measurement system of clause 11, wherein the digital filter comprises a sinc filter.

The signal measurement system of clause 11 or clause 12, further comprising a signal analyser configured to analyse the one or more filtered digital values to determine any one or more of:

a magnitude of the input signal;
an average of the magnitude of the input signal;
a variance of the magnitude of the input signal;
an entropy of the magnitude of the input signal;
a phase of the input signal;
an average of the phase of the input signal;
a variance of the phase of the input signal;
an entropy of the phase of the input signal;
a frequency of the input signal.

The signal measurement system of clause 10 or clause 13, wherein the signal analyser is configured to perform analysis using any one or more of: discrete Fourier transformation, DFT; fast Fourier transformation, FFT; discrete cosine transformation, DCT; wavelet processing.

The signal measurement system of any preceding clause, wherein the system is for measuring a characteristic of a device under test, DUT, and the input signal is a signal that is derived from the DUT, the system being further configured to:

measure the characteristic of the DUT using the plurality of digital samples.

The signal measurement system of clause 15, further comprising:

a signal generator for use in generating a test signal to be applied to the DUT when measuring the characteristic of the DUT, wherein the input signal is dependent on the test signal.

The signal measurement system of clause 16, wherein the signal generator is controllable to vary a frequency of the test signal so that the characteristic of the DUT can be measured at a plurality of different test signal frequencies.

The signal measurement system of any of clauses 15 to 17, wherein the characteristic of the DUT is an impedance of the DUT.

A method for digitally converting an input signal, the method comprising:

an analog-to-digital converter, ADC:
receiving the input signal; and
generating a plurality digital samples of the input signal; and
a controller controlling a number of digital conversions of the input signal performed by the ADC per unit time, based on at least one of:
a characteristic of the input signal;
a characteristic of a measurement of the input signal, wherein the measurement of the input signal is based on one or more previous digital samples of the input signal generated by the ADC.

A controller configured to control a number of digital conversions of the input signal performed by an analog to digital converter, ADC, per unit time, based on at least one of:

a characteristic of an input signal, wherein the input signal is input to the ADC for digital conversion;
a digitally determined characteristic of the input signal, wherein the digitally determined characteristic of the input signal is based on one or more previous digital samples of the input signal generated by the ADC.

The controller of clause 20, wherein the characteristic of the input signal comprises a frequency of the input signal.

The controller of clause 21, wherein the controller is configured to control the number of digital conversions of the input signal performed by the ADC per unit time such that:

a first number of digital conversions of the input signal are performed by the ADC per unit time when the frequency of the input signal is a first frequency; and
a second number of digital conversions of the input signal are performed by the ADC per unit time when the frequency of the input signal is a second frequency;
wherein the first number of digital conversions per unit time is less than the second number of digital samples per unit time, and
wherein the first frequency is less than the second frequency.

The controller of any of clauses 20 to 22, wherein the characteristic of the input signal comprises any one or more of:

a magnitude of the input signal;
a phase of the input signal.

The controller of any of clauses 20 to 23, wherein the digitally determined characteristic of the input signal comprises one or more of:

a magnitude of the input signal;
an average of the magnitude of the input signal;
a variance of the magnitude of the input signal;
an entropy of the magnitude of the input signal;
a phase of the input signal;

an average of the phase of the input signal;

a variance of the phase of the input signal;

an entropy of the phase of the input signal;

a frequency of the input signal.

The controller of any of clauses 20 to 24, wherein the ADC is configured to receive a clock signal for synchronisation of digital sample generation.

The controller of clause 25, wherein the controller is configured to control the number of digital conversions of the input signal performed by the ADC per unit time by controlling a frequency of the clock signal received by the ADC.

The controller of clause 25 or clause 26, wherein the ADC is configured to receive an enable signal that controls when the ADC is enabled to perform digital conversion, and wherein controller is configured to control the number of digital conversions of the input signal performed by the ADC per unit time by controlling a state of the enable signal.

The controller of any of clauses 25 to 27 configured to control the number of digital conversions of the input signal performed by the ADC per unit time by controlling a supply of power to the ADC.

The invention claimed is:

1. A signal measurement system for digitally converting an input signal, the system comprising:

an analog-to-digital converter, ADC, configured to:

receive the input signal; and generate a plurality digital samples of the input signal; and a controller configured to:

receive a characteristic of the input signal;

receive a digitally determined characteristic of the plurality digital samples of the input signal, wherein the digitally determined characteristic of the plurality digital samples of the input signal is based on one or more previous digital samples of the input signal generated by the ADC;

control the ADC based on the characteristic of the input signal and the digitally determined characteristic of the plurality digital samples of the input signal by using the characteristic of the input signal for initial adjustments of the ADC and using the digitally determined characteristic for subsequent adjustments of the ADC.

2. The signal measurement system of claim 1, wherein the characteristic of the input signal comprises a frequency of the input signal.

3. The signal measurement system of claim 2, wherein the controller is configured to control the number of digital conversions of the input signal performed by the ADC per unit time such that:

a first number of digital conversions of the input signal are performed by the ADC per unit time when the frequency of the input signal is a first frequency; and a second number of digital conversions of the input signal are performed by the ADC per unit time when the frequency of the input signal is a second frequency, wherein the first number of digital conversions per unit time is less than the second number of digital samples per unit time, and wherein the first frequency is less than the second frequency.

4. The signal measurement system of claim 1, wherein the characteristic of the input signal comprises any one or more of:

a magnitude of the input signal;

a phase of the input signal.

5. The signal measurement system of claim 1, wherein the digitally determined characteristic of the input signal comprises one or more of:

a magnitude of the input signal;

an average of the magnitude of the input signal;

a variance of the magnitude of the input signal;

an entropy of the magnitude of the input signal;

a phase of the input signal;

an average of the phase of the input signal;

a variance of the phase of the input signal;

an entropy of the phase of the input signal;

a frequency of the input signal.

6. The signal measurement system of claim 1, wherein the ADC is configured to receive a clock signal for synchronisation of digital sample generation.

7. The signal measurement system of claim 6, wherein the controller is configured to control the number of digital conversions of the input signal performed by the ADC per unit time by controlling a frequency of the clock signal received by the ADC.

8. The signal measurement system of claim 6, wherein the ADC is configured to receive an enable signal that controls when the ADC is enabled to perform digital conversion, and Wherein the controller is configured to control the number of digital conversions of the input signal performed by the ADC per unit time by controlling a state of the enable signal.

9. The signal measurement system of claim 6, wherein the controller is configured to control the number of digital conversions of the input signal performed by the ADC per unit time by controlling a supply of power to the ADC.

10. The signal measurement system of claim 1, further comprising a signal analyser configured to analyse the plurality of digital samples to determine any one or more of:

a magnitude of the input signal;

an average of the magnitude of the input signal;

a variance of the magnitude of the input signal;

an entropy of the magnitude of the input signal;

a phase of the input signal;

an average of the phase of the input signal;

a variance of the phase of the input signal;

an entropy of the phase of the input signal;

a frequency of the input signal.

11. The signal measurement system of claim 1, further comprising a digital filter configured to:

receive the plurality of digital samples;

generate one or more filtered digital values based on the plurality of digital samples; and output the one or more filtered digital values.

12. The signal measurement system of claim 11, further comprising a signal analyser configured to analyse the one or more filtered digital values to determine any one or more of:

a magnitude of the input signal;

an average of the magnitude of the input signal;

a variance of the magnitude of the input signal;

an entropy of the magnitude of the input signal;

a phase of the input signal;

an average of the phase of the input signal;

a variance of the phase of the input signal;

an entropy of the phase of the input signal;

a frequency of the input signal.

13. The signal measurement system of claim 1, wherein the system is for measuring a characteristic of a device under test, DUT, and the input signal is a signal that is derived from the DUT, the system being further configured to: measure the characteristic of the DUT using the plurality of digital samples.

14. The signal measurement system of claim 13, further comprising:

a signal generator for use in generating a test signal to be applied to the DUT when measuring the characteristic of the DUT, wherein the input signal is dependent on the test signal.

15. The signal measurement system of claim 14, wherein the signal generator is controllable to vary a frequency of the test signal so that the characteristic of the DUT can be measured at a plurality of different test signal frequencies.

16. The signal measurement system of claim 13, wherein the characteristic of the DUT is an impedance of the DUT.

17. A method for digitally converting an input signal, the method comprising:

an analog-to-digital converter, ADC:

receiving the input signal; and generating a plurality digital samples of the input signal;

receiving, by a controller, a characteristic of the input signal;

receiving, by the controller, a digitally determined characteristic of the plurality of digital samples of the input signal, wherein the digitally determined characteristic of the plurality of digital samples of the input signal is based on one or more previous digital samples of the input signal generated by the ADC; and controlling, by the controller, the ADC based on the characteristic of the input signal and the digitally determined characteristic of the plurality digital samples of the input signal by using the characteristic of the input signal for initial adjustments of the ADC and using the digitally determined characteristic for subsequent adjustments of the ADC.

18. A controller configured to control a number of digital conversions of the input signal performed by an analog to digital converter, ADC, per unit time, based on:

a characteristic of an input signal, wherein the input signal is input to the ADC for digital conversion; and a digitally determined characteristic of the input signal, wherein the digitally determined characteristic of the input signal is based on one or more previous digital samples of the input signal generated by the ADC.

19. The controller of claim 18, wherein the characteristic of the input signal comprises a frequency of the input signal.

20. The controller of claim 18, wherein the digitally determined characteristic of the input signal comprises one or more of:

a magnitude of the input signal;

an average of the magnitude of the input signal;

a variance of the magnitude of the input signal;

an entropy of the magnitude of the input signal;

a phase of the input signal;

an average of the phase of the input signal;

a variance of the phase of the input signal;

an entropy of the phase of the input signal;

a frequency of the input signal.

* * * * *